United States Patent
Tsuji et al.

(10) Patent No.: US 9,584,081 B2
(45) Date of Patent: *Feb. 28, 2017

(54) SIGNAL PROCESSING APPARATUS AND METHOD, PROGRAM, AND DATA RECORDING MEDIUM

(71) Applicant: SONY CORPORATION, Tokyo (JP)

(72) Inventors: Minoru Tsuji, Chiba (JP); Toru Chinen, Kanagawa (JP)

(73) Assignee: Sony Corporation, Tokyo (JP)

( * ) Notice: Subject to any disclaimer, the term of this patent is extended or adjusted under 35 U.S.C. 154(b) by 189 days.

This patent is subject to a terminal disclaimer.

(21) Appl. No.: 14/528,205

(22) Filed: Oct. 30, 2014

(65) Prior Publication Data
US 2015/0049874 A1    Feb. 19, 2015

Related U.S. Application Data

(63) Continuation of application No. 13/505,443, filed as application No. PCT/JP2011/070283 on Sep. 6, 2011, now Pat. No. 8,903,098.

(30) Foreign Application Priority Data

Sep. 8, 2010  (JP) ................................ 2010-201078

(51) Int. Cl.
*H03G 1/00*    (2006.01)
*H03G 7/00*    (2006.01)

(52) U.S. Cl.
CPC .............. *H03G 1/0005* (2013.01); *H03G 1/00* (2013.01); *H03G 7/002* (2013.01); *H03G 7/007* (2013.01); *H04R 2430/01* (2013.01)

(58) Field of Classification Search
CPC .............................. H03G 1/0005; H03G 7/002
(Continued)

(56) References Cited

U.S. PATENT DOCUMENTS 4,293,952 A    10/1981  Tamori et al.
4,991,218 A *  2/1991  Kramer ................ G10H 1/0091
                                                381/61
(Continued)

FOREIGN PATENT DOCUMENTS

EP    1251715 A2    10/2002
EP    2209326 A1     7/2010
(Continued)

OTHER PUBLICATIONS

Aug. 6, 2015, JP communication issued for related JP application No. 2010-201078.
(Continued)

*Primary Examiner* — Gerald Gauthier
(74) *Attorney, Agent, or Firm* — Paratus Law Group, PLLC

(57) ABSTRACT

The present invention relates to a signal processing apparatus and method, a program, and a data recording medium configured such that the playback level of an audio signal can be easily and effectively enhanced without requiring prior analysis. An analyzer 21 generates mapping control information in the form of the root mean square of samples in a given segment of a supplied audio signal. A mapping processor 22 takes a nonlinear function determined by the mapping control information taken as a mapping function, and conducts amplitude conversion on a supplied audio signal using the mapping function. In this way, by conducting amplitude conversion of an audio signal using a nonlinear function that changes according to the characteristics in respective segments of an audio signal, the playback level of an audio signal can be easily and effectively enhanced without requiring prior analysis. The present invention may be applied to portable playback apparatus.

14 Claims, 13 Drawing Sheets

(58) Field of Classification Search
USPC ...... 330/251; 341/50; 342/377; 345/82, 101; 367/135; 381/56, 57, 61, 74, 98, 100, 381/103, 104, 107, 123, 18, 22; 700/94; 704/500
See application file for complete search history.

(56) References Cited

U.S. PATENT DOCUMENTS

| | | | | |
|---|---|---|---|---|
| 5,023,609 | A * | 6/1991 | Reich | H03G 7/007 341/50 |
| 5,727,068 | A * | 3/1998 | Karagosian | H04S 3/00 381/20 |
| 5,841,875 | A * | 11/1998 | Kuroki | H03F 1/327 381/61 |
| 5,898,340 | A * | 4/1999 | Chatterjee | H03F 3/2171 330/251 |
| 6,044,341 | A | 3/2000 | Takahashi | |
| 6,097,824 | A | 8/2000 | Lindemann et al. | |
| 6,163,504 | A * | 12/2000 | Komninos | G01H 3/00 367/135 |
| 6,216,100 | B1 | 4/2001 | Meghdadi et al. | |
| 6,591,234 | B1 | 7/2003 | Chandran et al. | |
| 7,039,194 | B1 * | 5/2006 | Kemp | G10K 15/02 381/103 |
| 7,302,065 | B2 | 11/2007 | Furuta | |
| 7,558,636 | B2 | 7/2009 | Arndt et al. | |
| 7,783,050 | B2 | 8/2010 | Oh et al. | |
| 7,844,017 | B2 | 11/2010 | Wiss | |
| 7,995,767 | B2 * | 8/2011 | Amada | G10L 19/008 381/17 |
| 8,050,422 | B2 | 11/2011 | Zhao et al. | |
| 8,082,157 | B2 | 12/2011 | Pang et al. | |
| 8,239,191 | B2 | 8/2012 | Ehara et al. | |
| 8,335,685 | B2 | 12/2012 | Hetherington | |
| 8,461,443 | B2 | 6/2013 | McKinney et al. | |
| 8,467,307 | B2 | 6/2013 | Boschma | |
| 8,515,107 | B2 | 8/2013 | Hain et al. | |
| 8,634,577 | B2 | 1/2014 | Breebaart | |
| 8,903,098 | B2 * | 12/2014 | Tsuji | H03G 7/007 370/252 |
| 2002/0131611 | A1 * | 9/2002 | Hoover | H04R 5/04 381/123 |
| 2003/0160745 | A1 * | 8/2003 | Osame | G09G 3/3258 345/82 |
| 2004/0161116 | A1 * | 8/2004 | Tsuji | G10L 19/008 381/22 |
| 2004/0189520 | A1 * | 9/2004 | Song | H04B 7/0854 342/377 |
| 2004/0201564 | A1 * | 10/2004 | Sugino | G09G 3/3611 345/101 |
| 2005/0147262 | A1 | 7/2005 | Breebaart | |
| 2006/0120539 | A1 * | 6/2006 | Willems | H04R 5/04 381/98 |
| 2008/0008336 | A1 * | 1/2008 | Tanaka | H03G 3/001 381/104 |
| 2009/0161889 | A1 * | 6/2009 | Magrath | H03G 7/007 381/107 |
| 2010/0128902 | A1 * | 5/2010 | Liu | H03G 5/025 381/103 |
| 2011/0093102 | A1 * | 4/2011 | Aichner | H04M 9/082 700/94 |
| 2011/0200203 | A1 * | 8/2011 | Chu | H04R 3/007 381/74 |
| 2012/0008793 | A1 * | 1/2012 | Knox | H04R 1/10 381/74 |
| 2012/0116780 | A1 * | 5/2012 | Tsuji | G10L 19/008 704/500 |
| 2012/0170769 | A1 * | 7/2012 | McGrath | G10L 21/0205 381/100 |
| 2012/0275625 | A1 * | 11/2012 | Kono | H03G 7/002 381/107 |
| 2013/0094669 | A1 * | 4/2013 | Kono | G10L 25/48 381/107 |
| 2013/0156206 | A1 | 6/2013 | Tsuji et al. | |
| 2015/0049874 | A1 * | 2/2015 | Tsuji | H03G 7/007 381/56 |

FOREIGN PATENT DOCUMENTS

| | | |
|---|---|---|
| JP | 05-234249 | 9/1993 |
| JP | 05-275950 | 10/1993 |
| JP | 07-131270 | 5/1995 |
| JP | 07-288899 | 10/1995 |
| JP | 2002-504279 | 2/2002 |
| JP | 2002-084154 | 3/2002 |
| JP | 2004-288046 | 10/2004 |
| JP | 2005-129221 | 5/2005 |
| JP | 2007-067868 | 3/2007 |
| JP | 2011-509010 | 3/2011 |
| WO | WO2010/005033 A1 | 1/2010 |

OTHER PUBLICATIONS

Feb. 3, 2015, JP communication issued for related JP application No. 2010-201078.
May 29, 2014, Japanese Office Action for related JP application No. 2010-201078.
English-language translation of International Search Report from the Japanese Patent Office of International Application No. PCT/JP2011/070283, mailed Oct. 4, 2011.
Nov. 26, 2013, Chinese Office Action issued for related CN application No. 201180004404.2.
Jan. 11, 2016, European Search Report for related EP Application No. 11823574.6-1810.

* cited by examiner

SIGNAL PROCESSING APPARATUS AND METHOD, PROGRAM, AND DATA RECORDING MEDIUM

CROSS REFERENCE TO PRIOR APPLICATION

This application is a continuation of U.S. patent application Ser. No. 13/505,443 (filed on May 1, 2012), which is a National Stage Patent Application of PCT International Patent Application No. PCT/JP2011/070283 (filed on Sep. 6, 2011) under 35 U.S.C. §371, which claims priority to Japanese Patent Application No. 2010-201078 (filed on Sep. 8, 2010), which are all hereby incorporated by reference in their entirety.

TECHNICAL FIELD

The present invention relates to a signal processing apparatus and method, a program, and a data recording medium, and more particularly, relates to a signal processing apparatus and method, a program, and a data recording medium configured such that the playback level of an audio signal can be easily and effectively enhanced without requiring additional information given by prior analysis.

BACKGROUND ART

For example, in the case where movie content or music content with a large dynamic range in audio volume is played back on a portable device with compact built-in speakers, not only does the audio volume become lower overall, but audio such as low-volume dialogue in particular becomes difficult to hear.

Thus, although normalization and automatic gain control technology does exist as technology for making the audio of such content easier to hear, volume control becomes audibly unstable unless data is read sufficiently far enough ahead.

There also exists technology that boosts low-volume portions and compresses high-volume portions of audio by means of a dynamic range compression process for volume. However, with a compression process, it is difficult to obtain large audio enhancement effects if generalized volume boost and compression settings are used. In order to obtain large effects, it is necessary to vary settings on a per-content basis.

For example, there exists technology that takes a sound pressure level specified by dialogue normalization as a basis, boosting signals with a lower sound pressure level and compressing signals with a higher sound pressure level. With this technology, however, it is necessary to specify boost and compression settings and a sound pressure level for dialogue normalization at the time of encoding the audio signal in order to obtain sufficient effects.

Furthermore, technology has also been proposed in which, in the case of compressing the dynamic range of audio volume, faint sounds in an audio signal are made easier to hear by multiplying the audio signal by coefficients determined by the average of the absolute values of the audio signal (see PTL 1, for example).

CITATION LIST

Patent Literature

PTL 1: Japanese Unexamined Patent Application Publication No. 5-275950

SUMMARY OF INVENTION

Technical Problem

Meanwhile, various types of content such as movies, music, and self-recorded content are coming to be played back on portable devices with compact built-in speakers. However, much of such content lacks additional information for effective volume control given by prior analysis done at the time of encoding, etc. as discussed above. For this reason, there is a need for technology that effectively conducts volume control even in cases where additional information obtained by prior analysis is not included in the audio signal of given content.

Accordingly, if the technology described in PTL 1 discussed above is used, it becomes possible to suppress sudden changes in loudness while making faint sounds in an audio signal easier to hear by means of a compression process, without requiring prior analysis of the audio signal. However, the playback level of an audio signal cannot be sufficiently enhanced with this technology.

For example, with the technology described in PTL 1, since amplitude is simply damped by multiplying an audio signal by a constant, there is little freedom in amplitude conversion settings, and it cannot be said that the playback level of an audio signal can be effectively enhanced. Also, this technology can only be used in the case of narrowing the dynamic range of volume by amplitude conversion of an audio signal. Converting amplitude without changing the dynamic range of volume or widening the dynamic range of volume cannot be conducted.

The present invention, being devised in light of such circumstances, is configured such that the playback level of an audio signal can be easily and effectively enhanced without requiring additional information given by prior analysis.

Solution to Problem

A signal processing apparatus of a first aspect of the present invention comprises analyzing means analyzing input signal characteristics, mapping processing means conducting amplitude conversion of the input signal on the basis of a predetermined linear function or nonlinear function, weighting controlling means respectively multiplying a plurality of the input signals, which have been respectively amplitude-converted on the basis of mutually different functions by a plurality of the mapping processing means, by weights determined by the analysis result for the input signal characteristics, and adding means generating an output signal by adding together the plurality of input signals which have been multiplied by the weights.

The analyzing means may be made to compute a value expressing the average sample value of samples included in a given segment of the input signal as the analysis result.

The analysis result may be taken to be the root mean square or a moving average of sample values of samples included in the given segment.

In the case where amplitude conversion is conducted on the input signal for each of a plurality of channels to generate an output signal for each channel, the analyzing means may be made to compute one analysis result shared by all channels.

It may be configured such that the weights are determined by the analysis result for every single sample of the input signal.

It may be configured such that the weights are determined by the analysis result for every given number of two or more consecutive samples of the input signal.

A signal processing method or program of a first aspect of the present invention includes the steps of analyzing input signal characteristics, conducting amplitude conversion of the input signal on the basis of a predetermined linear function or nonlinear function, respectively multiplying a plurality of the input signals, which have been amplitude-converted on the basis of a plurality of mutually different functions, by weights determined by the analysis result for the input signal characteristics, and generating an output signal by adding together the plurality of input signals which have been multiplied by the weights.

In a first aspect of the present invention, input signal characteristics are analyzed, amplitude conversion of the input signal is conducted on the basis of a predetermined linear function or nonlinear function, a plurality of the input signals, which have been respectively amplitude-converted on the basis of mutually different functions by a plurality of the mapping processing means, are respectively multiplied by weights determined by the analysis result for the input signal characteristics, and an output signal is generated by adding together the plurality of input signals which have been multiplied by the weights.

A data recording medium of a second aspect of the present invention has recorded thereon an output signal obtained by analyzing input signal characteristics, conducting amplitude conversion of the input signal on the basis of a predetermined linear function or nonlinear function, respectively multiplying a plurality of the input signals, which have been amplitude-converted on the basis of a plurality of mutually different functions, by weights determined by the analysis result for the input signal characteristics, and adding together the plurality of input signals which have been multiplied by the weights.

A signal processing apparatus of a third aspect of the present invention comprises analyzing means analyzing input signal characteristics, and mapping processing means generating an output signal by conducting amplitude conversion of the input signal on the basis of a nonlinear function determined by the analysis result for the input signal characteristics.

The analyzing means may be made to compute a value expressing the average sample value of samples included in a given segment of the input signal as the analysis result.

The analysis result may be taken to be the root mean square or a moving average of sample values of samples included in the given segment.

In the case where amplitude conversion is conducted on the input signal for each of a plurality of channels to generate an output signal for each channel, the analyzing means may be made to compute one analysis result shared by all channels on the basis of the input signals in the plurality of channels.

The nonlinear function may be determined by the analysis result for every single sample of the input signal.

The nonlinear function may be determined by the analysis result for every given number of two or more consecutive samples of the input signal.

A signal processing method or program of a third aspect of the present invention includes the steps of analyzing input signal characteristics, and generating an output signal by conducting amplitude conversion of the input signal on the basis of a nonlinear function determined by the analysis result for the input signal characteristics.

In a third aspect of the present invention, input signal characteristics are analyzed, and an output signal is generated by conducting amplitude conversion of the input signal on the basis of a nonlinear function determined by the analysis result for the input signal characteristics.

A data recording medium of a fourth aspect of the present invention has recorded thereon an output signal obtained by analyzing input signal characteristics, and conducting amplitude conversion of the input signal on the basis of a nonlinear function determined by the analysis result for the input signal characteristics.

Advantageous Effects of Invention

According to the first through fourth aspects of the present invention, the playback level of an audio signal can be easily and effectively enhanced without requiring additional information given by prior analysis.

DESCRIPTION OF EMBODIMENTS

Hereinafter, embodiments applying the present invention will be described with reference to the drawings.

First Embodiment

Configuration of Audio Signal Processing Apparatus

Figure 1:
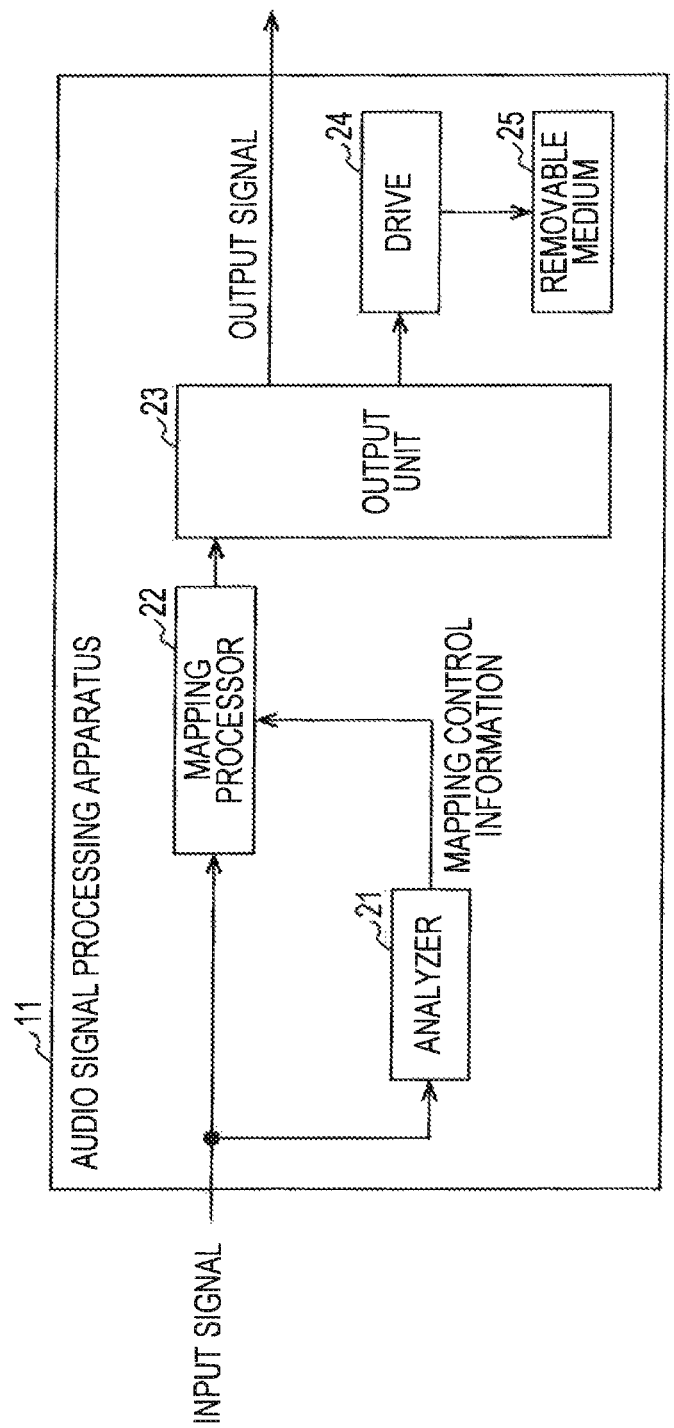
FIG. 1 is a diagram illustrating an exemplary configuration of a first embodiment of an audio signal processing apparatus applying the present invention.

FIG. 1 is a diagram illustrating an exemplary configuration of an embodiment of an audio signal processing apparatus applying the present invention.

The audio signal processing apparatus 11 is provided in a portable playback apparatus that plays back content consisting of video signals and audio signals, for example, and conducts amplitude conversion on an input audio signal such that the playback level is enhanced, and outputs the amplitude-converted audio signal. Note that hereinafter, an audio signal input specifically input into the audio signal processing apparatus 11 is designated an input signal, while an audio signal obtained by amplitude-converting an input signal is designated an output signal.

The audio signal processing apparatus 11 is composed of an analyzer 21, a mapping processor 22, an output unit 23, and a drive 24.

The analyzer 21 analyzes the characteristics of a supplied input signal, and supplies mapping control information indicating the analysis results to the mapping processor 22.

The mapping processor 22 uses mapping control information supplied from the analyzer 21 to conduct a mapping process on a supplied input signal and enhance the playback level of the input signal. In the mapping process, linear or non-linear amplitude conversion is conducted on an input signal. The mapping processor 22 supplies the output unit 23 with an output signal obtained by the mapping process.

The output unit 23 may output an output signal supplied from the mapping processor 22 to a subsequent audio output unit, etc. or supply it to the drive 24. The drive 24 records an output signal supplied from the output unit 23 to a removable medium 25, which is a recording medium able to be freely inserted into and removed from the drive 24.

[Description of Conversion Process]

Next, operation of the audio signal processing apparatus 11 in FIG. 1 will be described.

The audio signal processing apparatus 11 conducts a conversion process upon being supplied with an input signal, and generates and outputs an output signal. Hereinafter, a conversion process conducted by the audio signal processing apparatus 11 will be described with reference to the flowchart in FIG. 2.

In step S11, the analyzer 21 analyzes the characteristics of a supplied input signal, and generates mapping control information.

Specifically, the analyzer 21 may, for example, perform the computation in the following Eq. 1, and compute the root mean square RMS(n) for the nth sample of the input signal as mapping control information for the nth sample.

[Expression 1]

$$\text{RMS}(n) = 20.0 \times \log_{10}\left(\sqrt{\frac{1}{N} \cdot \sum_{m=n-N/2}^{m+N/2-1} (x(m))^2}\right) \quad (1)$$

In Eq. 1 herein, x(m) represents the sample value of the mth sample of the input signal (the input signal value). Also, in Eq. 1, the input signal values, or in other words the sample values of each input signal sample, are taken to be normalized such that $-1 \le x(m) \le 1$.

Consequently, the root mean square RMS(n) is obtained by taking the logarithm of the square root of the mean square value of the sample values for samples included in a segment consisting of N consecutive samples centered about the nth sample, and multiplying the value thus obtained by the constant 20.

Values of the root mean square RMS(n) obtained in this way decrease with decreasing absolute values of the sample values for the samples in a specific segment centered about the nth sample of the input signal being processed. In other words, the root mean square RMS(n) decreases as the overall audio volume decreases in a specific segment that includes the input signal sample being processed.

Once the analyzer 21 analyzes an input signal and mapping control information is obtained, the mapping control information is supplied to the mapping processor 22.

In step S12, the mapping processor 22 uses mapping control information from the analyzer 21 to conduct a mapping process on a supplied input signal, and generates an output signal.

Specifically, the mapping processor 22 converts amplitude by substituting the sample value x of the nth sample of an input signal with the nonlinear mapping function f(x) expressed in the following Eq. 2. In other words, the value obtained by substituting the sample value x with the mapping function f(x) is taken to be the sample value of the nth sample of the output signal.

[Expression 2]

$$f(x) = \begin{cases} (2-\alpha)x - (\alpha-1) & (-1.0 \le x < -0.5) \\ \alpha x & (-0.5 \le x \le 0.5) \\ (2-\alpha)x + (\alpha-1) & (0.5 < x \le 1.0) \end{cases} \quad (2)$$

In Eq. 2 herein, the sample value x of an input signal is taken to be normalized to a value from −1 to 1. Also, in Eq. 2, α represents a control factor, with the control factor α being a numerical value determined by the value of the mapping control information.

According to Eq. 2, in the case where the sample value x is −1 or greater but less than −0.5, the mapping function f(x) becomes (2−α)x−(α−1), whereas in the case where the sample value x is between −0.5 and 0.5 inclusive, the mapping function f(x) becomes αx. Also, in the case where the sample value x is greater than 0.5 but 1 or less, the mapping function f(x) becomes (2−α)x+(α−1).

Additionally, the control factor α is taken to be a value determined by the following Eq. 3, for example.

[Expression 3]

$$\alpha = \begin{cases} \dfrac{\text{RMS}(n)}{-30.0} + 1.0 & (-30.0 < \text{RMS}(n) \le 0.0) \\ 2.0 & (\text{RMS}(n) \le -30.0) \end{cases} \quad (3)$$

In other words, in the case where the value of the root mean square RMS(n) given to be the mapping control information is greater than −30 but 0 or less, the value of the control factor α is taken to be (RMS(n)/−30)+1. At this point, the range of values that the control factor α may take becomes $1 \le \alpha < 2$, with the value of the control factor α decreasing as the root mean square RMS(n) increases. Also, in the case where the value of the root mean square RMS(n) is −30 or less, the value of the control factor α is taken to be 2.

Consequently, the control factor α increases as the volume of audio based on an input signal decreases overall, or in other words as the root mean square RMS(n) decreases. As a result, the slope of the mapping function f(x) increases as illustrated in FIG. 3.

Figure 3:
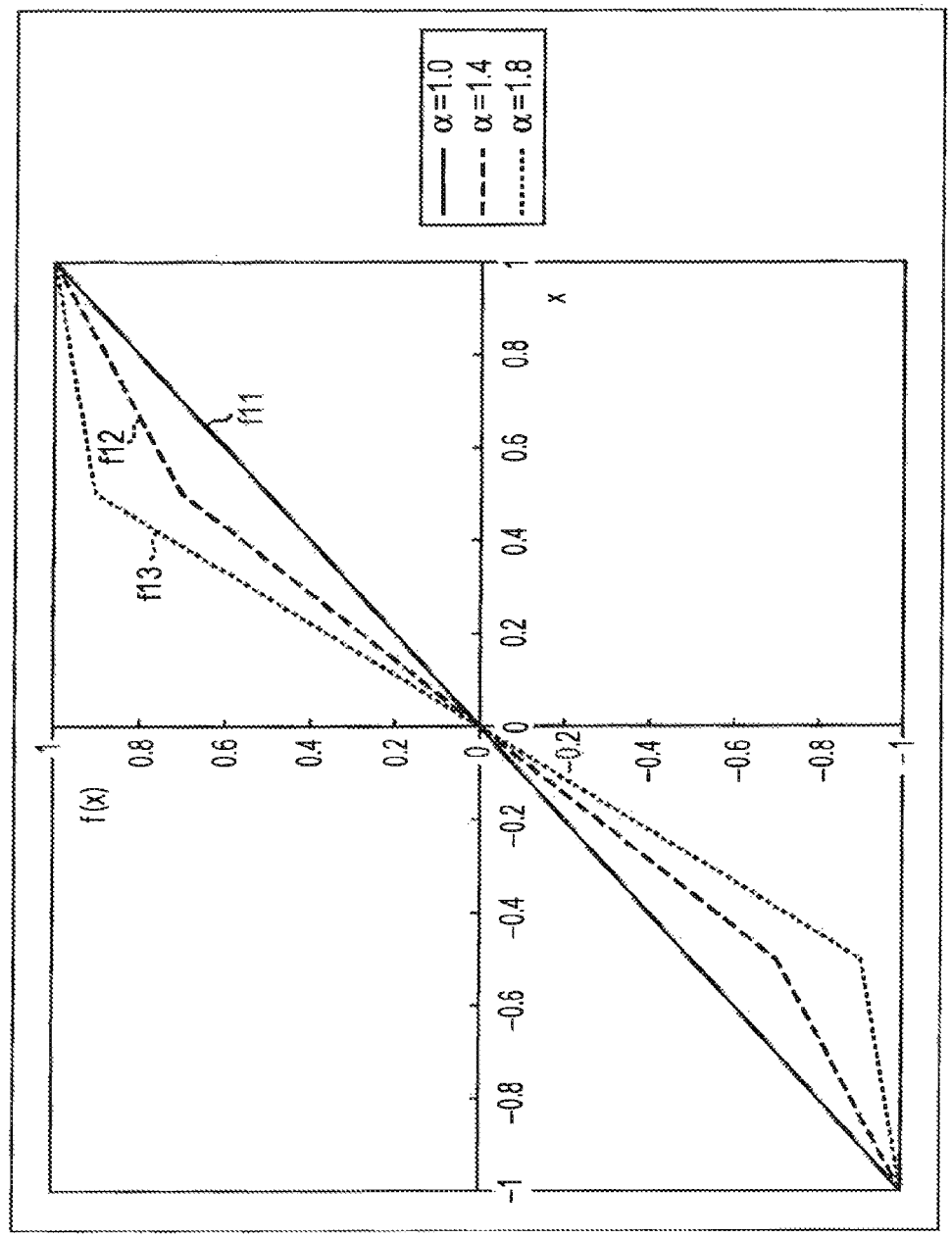
FIG. 3 is a diagram illustrating exemplary mapping functions.

In FIG. 3 herein, the horizontal axis represents the sample value x of an input signal, while the vertical axis represents the value of the mapping function f(x). Also, the line f11, the curve f12, and the curve f13 represent the mapping function f(x) for a control factor α of 1.0, 1.4, and 1.8, respectively.

As FIG. 3 demonstrates, as the volume of audio based on an input signal decreases overall, amplitude conversion of the input signal is conducted using a steeper mapping function f(x). In other words, as the audio volume decreases overall, the rate of change in f(x) versus change in the sample value x increases in the mapping function f(x).

For example, for a control factor α of 1.0 and a mapping function f(x) expressed by the line f11, a sample value in the input signal is taken without change as a sample value in the output signal. In contrast, with a control factor α of 1.8 and a mapping function f(x) expressed by the curve f13, the slope of the mapping function becomes greater than the slope of the mapping function expressed by the line f11 in the segment where the sample value x of an input signal is between −0.5 and 0.5 inclusive.

In this way, as the volume of audio in an input signal decreases overall, amplitude conversion of the input signal is conducted using a mapping function f(x) with steeper characteristics in the segment for most sample values x, including sample values x equal to 0.

Consequently, in segments where the audio of an input signal is at low volume overall, the input signal is amplitude-converted such that low-volume audio is converted into higher-volume audio, enhancing the playback level of the input signal. Thus, even faint sounds that have been conventionally difficult to hear can be made easier to hear by a mapping process conducted on an input signal, even in cases where movies or other content with a large dynamic range in volume is played back on a portable device housing compact speakers.

Also, even in segments where the audio of an input signal is at high volume overall, amplitude conversion of the input signal is conducted using a mapping function f(x) with appropriately steep characteristics on the parts of the signal with small sample values x therein.

Consequently, even in segments where the audio of an input signal is at high volume overall, the input signal is amplitude-converted such that faint audio therein is converted into loud audio, enhancing the playback level of the input signal. Thus, even sounds that conventionally have been played back comparatively loudly become heard even more loudly.

Moreover, with the audio signal processing apparatus, 11, it is not necessary to analyze an input signal in advance and add additional information for amplitude conversion to the input signal, or to read ahead long segments of an input signal and analyze the read input signal before conducting amplitude conversion.

Also, by varying a nonlinear mapping function f(x) according to a control factor α, amplitude conversion with a higher degree of freedom can be realized. In other words, by taking the nonlinear function with the most effective characteristics as the mapping function depending on the overall characteristics of a specific segment of an input signal, amplitude conversion can be conducted while taking into account not only the characteristics of the segment containing the sample being processed, but also the magnitude of the sample value for that sample.

For example, with the technology described in PTL 1 discussed earlier, an audio signal is multiplied by a constant determined by the average of the absolute values of the audio signal, irrespectively of the audio signal values. In other words, a sample of an audio signal would be always a constant multiple, regardless of the magnitude of the amplitude of that sample.

For this reason, if a computation method that multiplies an audio signal by a constant is determined with respect to comparatively low-volume audio in order to increase the volume of that audio, high-volume audio may not reach a suitable volume even if the audio signal is multiplied by a constant.

In contrast, with the audio signal processing apparatus 11, if the mapping function is taken to be a nonlinear function, amplitude conversion with a high degree of freedom becomes possible, such as greatly increasing the amplitude in the case where the sample amplitude (sample value) is small, but not greatly changing the amplitude in the case where the sample amplitude is large. Thus, the playback level of an audio signal can be effectively enhanced, such as by converting low-volume audio into higher-volume audio while also not significantly changing the volume of audio that was at high volume to begin with.

Furthermore, by appropriately setting a mapping function f(x), the dynamic range in audio volume can be widened, kept the same, or the dynamic range can be narrowed by amplitude conversion.

In this way, with the audio signal processing apparatus 11, the playback level of an audio signal can be easily and effectively enhanced.

Figure 2:
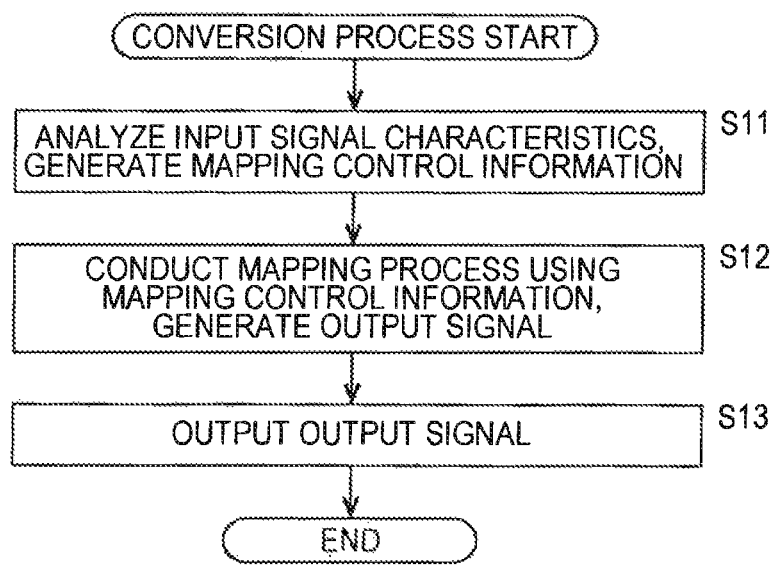
FIG. 2 is a flowchart explaining a conversion process.

Returning to the description of the flowchart in FIG. 2, upon generating an output signal by means of a mapping process, the mapping processor 22 supplies the obtained output signal to the output unit 23.

In step S13, the output unit 23 outputs an output signal supplied from the mapping processor 22 to a subsequent unit, and the conversion process ends. The output unit 23 may also supply the output signal to the drive 24 as necessary, with the drive 24 recording the supplied output signal to the removable medium 25.

As above, the audio signal processing apparatus 11 analyzes the characteristics of an input signal and uses a mapping function that varies according to the analysis results to conduct a mapping process on the input signal and generate an output signal.

The root mean square RMS(n) taken as the mapping control information obtained by analyzing an input signal expresses the average magnitude of sample values in a given segment of an input signal, or in other words, an amplitude distribution of samples in a given segment. For example, in the case where the root mean square RMS(n) is small, many samples of low amplitude are contained in the input signal, whereas in the opposite case where the root mean square RMS(n) is large, many samples of high amplitude are contained in the input signal.

In the audio signal processing apparatus 11, by using the root mean square RMS(n) to generate a mapping function with more effective characteristics and then conduct a mapping process, an input signal can be easily converted into an output signal having an ideal amplitude distribution.

<Modification 1>

Although the foregoing describes using a function which is linear in each segment as the mapping function, a function with smoother curves may also be used as the mapping function. In such cases, the nonlinear function expressed in the following Eq. 4 may be taken to be the mapping function, for example.

[Expression 4]

$$f(x) = \frac{2}{1 + e^{-\alpha x}} - 1 \qquad (-1.0 \le x \le 1.0) \qquad (4)$$

In Eq. 4 herein, x represents the sample value of an input signal sample. The input signal sample value x is taken to be normalized to a value from −1 to 1. Also, the control factor α in Eq. 4 is determined by the following Eq. 5.

[Expression 5]

$$\alpha = \begin{cases} \dfrac{RMS(n)}{-30.0} \times 5.0 + 1.0 & (-30.0 < RMS(n) \le 0.0) \\ 10.0 & (RMS(n) \le -30.0) \end{cases} \quad (5)$$

In other words, in the case where the value of the root mean square RMS(n) given to be the mapping control information is greater than −30 but 0 or less, the value of the control factor α is taken to be (RMS(n)/−30)×5+5. At this point, the range of values that the control factor α may take becomes 5≤α<10, with the value of the control factor α decreasing as the root mean square RMS(n) increases. Also, in the case where the value of the root mean square RMS(n) is −30 or less, the value of the control factor α is taken to be 10.

Consequently, the control factor α increases as the volume of audio based on an input signal decreases overall, or in other words as the root mean square RMS(n) decreases. As a result, the slope of the mapping function f(x) varies as illustrated in FIG. 4.

Figure 4:
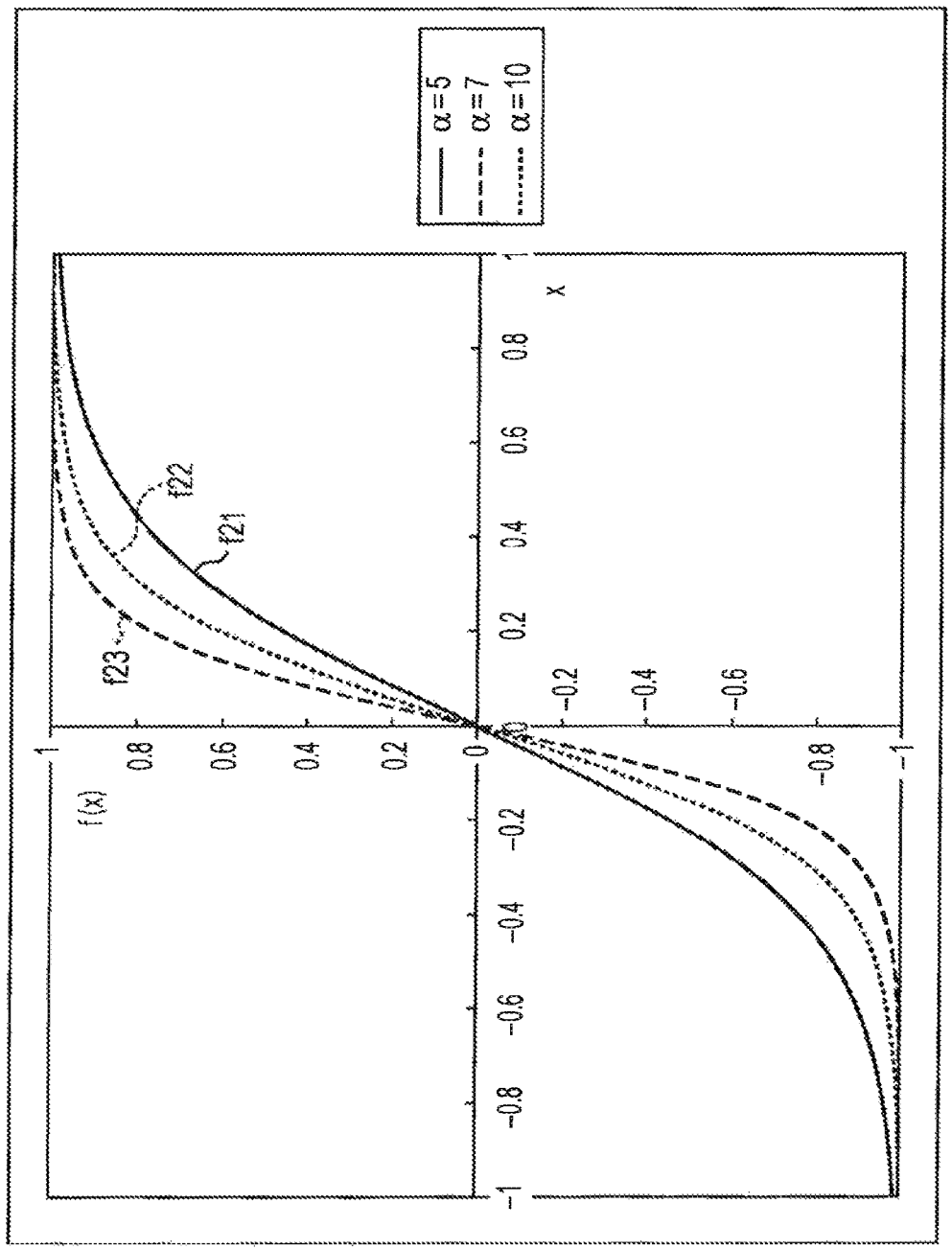
FIG. 4 is a diagram illustrating exemplary mapping functions.

In FIG. 4 herein, the horizontal axis represents the sample value x of an input signal, while the vertical axis represents the value of the mapping function f(x). Also, the curves f21 to f23 represent the mapping function f(x) for a control factor α of 5, 7, and 10, respectively.

As FIG. 4 demonstrates, as the volume of audio based on an input signal decreases overall, amplitude conversion of the input signal is conducted using a mapping function f(x) with a greater overall rate of change versus change in the sample value x. In other words, as the volume of audio based on an input signal decreases overall, a steeper mapping function f(x) is used in the segment for most sample values x, including sample values x equal to 0.

In this way, in the case of using the mapping function expressed in Eq. 4 and the control factor α expressed in Eq. 5, the mapping function takes on steeper characteristics as the root mean square RMS(n) decreases, similarly to the case of using the mapping function in Eq. 2 and the control factor α in Eq. 3. Likewise in this case, the playback level of an audio signal can be more easily and effectively enhanced without requiring prior analysis or reading ahead of the input signal. Furthermore, faint sounds that have been conventionally difficult to hear can be made easier to hear, while in addition, even sounds that have been comparatively loud conventionally become even easier to hear.

<Modification 2>

Meanwhile, since the mapping function in Eq. 4 discussed above is an exponential function, if computation of the mapping process is performed by a computer or DSP (Digital Signal Processor), etc., the computational load typically increases. Thus, by adopting the cubic function expressed in the following Eq. 6 as the mapping function, for example, the computational load can be decreased, and the mapping process can be conducted more rapidly.

[Expression 6]

$$f(x) = \dfrac{\alpha}{\alpha - 1}\left(x - \dfrac{1}{\alpha}x^3\right) \quad (-1.0 \le x \le 1.0) \quad (6)$$

In Eq. 6 herein, x represents the sample value of an input signal sample. The input signal sample value x is taken to be normalized to a value from −1 to 1. Also, the control factor α in Eq. 6 is determined by the following Eq. 7.

[Expression 7]

$$\alpha = \begin{cases} 100.0 & (-0.9 \le RMS(n) \le 0.0) \\ \dfrac{-30.0}{RMS(n)} \times 3.0 & (-30.0 < RMS(n) < -0.9) \\ 3.0 & (RMS(n) \le -30.0) \end{cases} \quad (7)$$

In other words, in the case where the value of the root mean square RMS(n) given to be the mapping control information is between −0.9 and 0 inclusive, the control factor α is taken to be 100, whereas in the case where the value of the root mean square RMS(n) is greater than −30 but less than −0.9, the value of the control factor α is taken to be −30/RMS(n)×3. At this point, the range of values that the control factor α may take becomes 3<α<100, with the value of the control factor α increasing as the root mean square RMS(n) increases. Also, in the case where the value of the root mean square RMS(n) is −30 or less, the value of the control factor α is taken to be 3.0.

Consequently, the control factor α decreases as the volume of audio based on an input signal decreases overall, or in other words as the root mean square RMS(n) decreases. As a result, the mapping function f(x) varies steeply as illustrated in FIG. 5.

Figure 5:
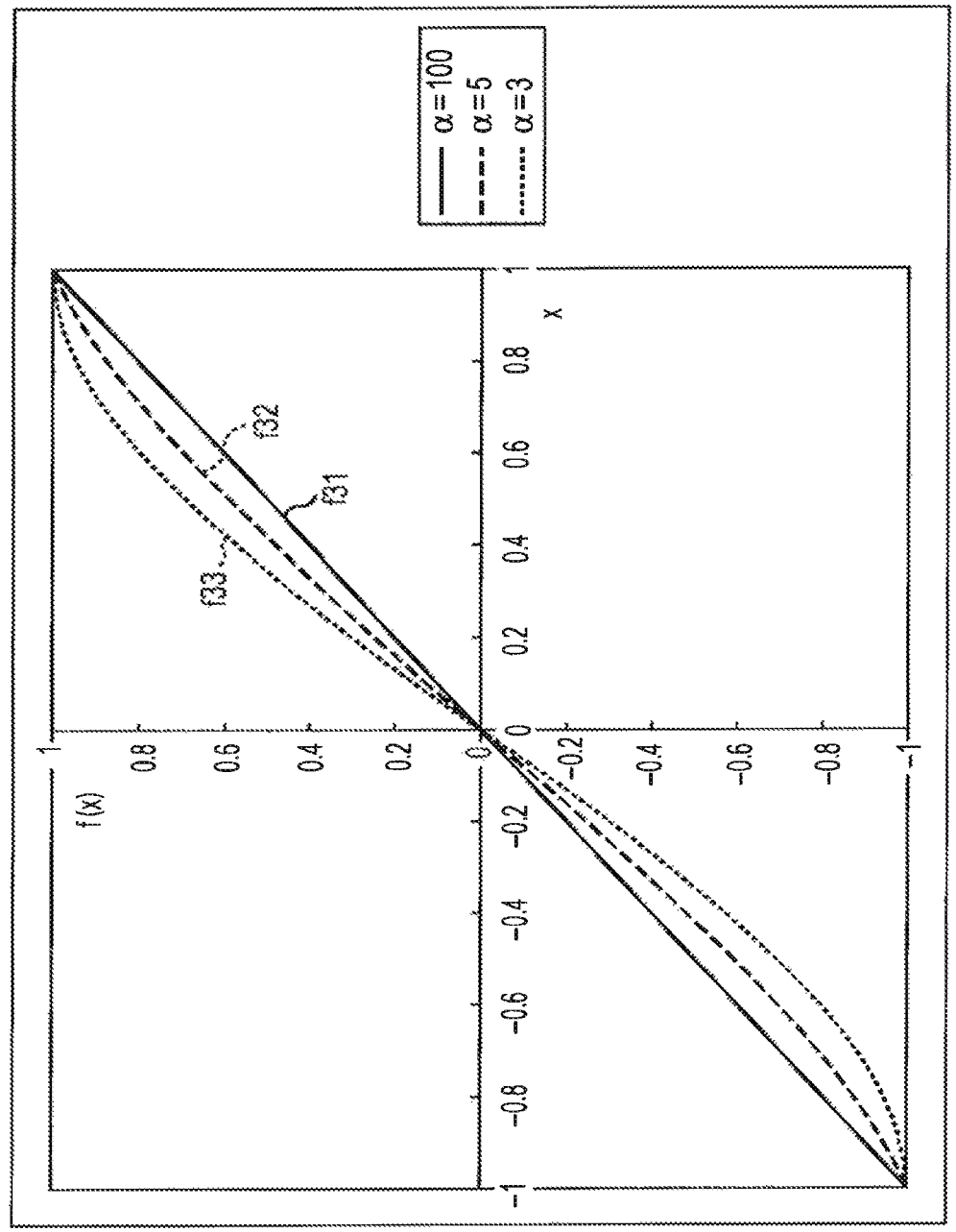
FIG. 5 is a diagram illustrating exemplary mapping functions.

In FIG. 5 herein, the horizontal axis represents the sample value x of an input signal, while the vertical axis represents the value of the mapping function f(x). Also, the curves f31 to f33 represent the mapping function f(x) for a control factor α of 100, 5, and 3, respectively.

As FIG. 5 demonstrates, as the volume of audio based on an input signal decreases overall, amplitude conversion of the input signal is conducted using a mapping function f(x) with a greater overall rate of change versus change in the sample value x.

In this way, in the case of using the mapping function expressed in Eq. 6 and the control factor α expressed in Eq. 7, the mapping function takes on steeper characteristics as the root mean square RMS(n) decreases, similarly to the case of using the mapping function in Eq. 2 and the control factor α in Eq. 3. Likewise in this case, the playback level of an audio signal can be more easily and effectively enhanced without requiring prior analysis or reading ahead of the input signal. Furthermore, faint sounds that have been conventionally difficult to hear can be made easier to hear, while in addition, even sounds that have been comparatively loud conventionally become even easier to hear.

Note that the mapping function f(x) may be any function insofar as the function becomes −1≤f(x)≤1 for sample values x where −1≤x≤1.

Also, although an example of using the root mean square RMS(n) as mapping control information for determining a control factor α is described in the foregoing, the mapping control information may be another element, or may be taken to be mapping control information combining multiple elements. For example, the moving average of sample values for samples in a given segment of an input signal, the number of zero-crossings in samples in a given segment, or a value expressing the tonality of an input signal may also be taken to be mapping control information. In other words, it may be configured such that elements with large processing effects, whereby audio suitable for listening is obtained by the mapping process, may be used for the mapping function, the control factor α, and the mapping control information.

Also, although the foregoing describes conducting a mapping process by computing mapping control information and a control factor α for the mapping function for every single sample of an input signal, the mapping process may also be conducted by computing mapping control information and a control factor α for every two or more consecutive samples. For example, in such cases, the mapping control information and control factor computed for one sample may be successively used for a given number of consecutive samples.

Furthermore, it may also be configured such that the method for computing mapping control information or a control factor is varied according to the output device for the output signal, etc., so as to adjust the degree of enhancement to the playback level of an audio signal. Specifically, the relationship between the control factor α and the mapping control information may be varied, such as by using different formulas for computing the control factor α, for example.

Second Embodiment

Configuration of Audio Signal Processing Apparatus

Meanwhile, in the case where an audio signal given as an input signal has two or more channels, inter-channel volume balance of audio based on the output signal may change if analysis of input signal characteristics or a mapping process is conducted independently on each channel.

Figure 6:
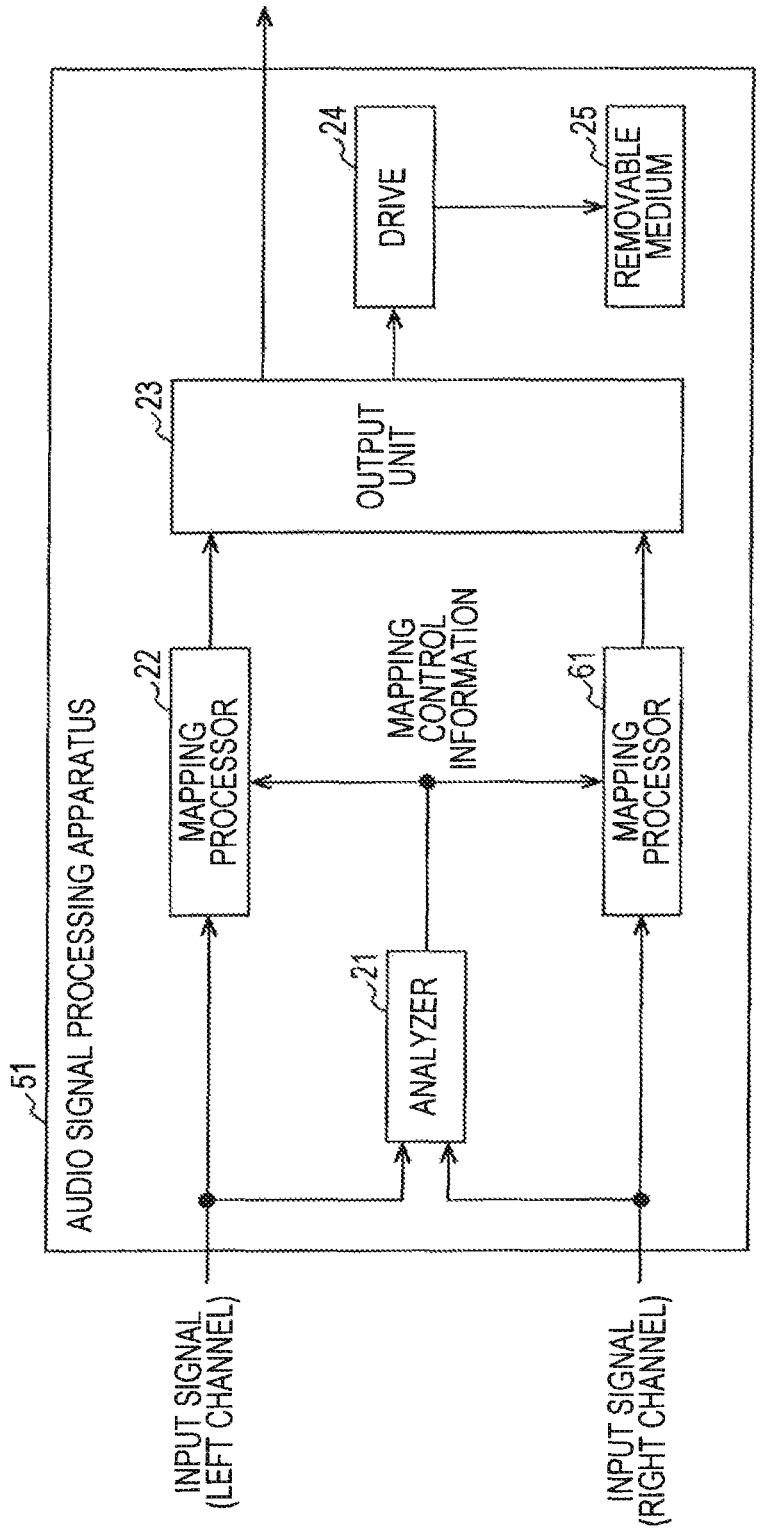
FIG. 6 is a diagram illustrating another exemplary configuration of an audio signal processing apparatus.

For this reason, it is desirable to conduct identical analyses and mapping processes on the input signals in all channels. Thus, it may also be configured such that characteristics are analyzed for the input signals in all channels, and a mapping process is conducted using one set of mapping control information obtained from the analysis results. In such cases, the audio signal processing apparatus may be configured as illustrated in FIG. 6, for example.

The audio signal processing apparatus 51 is composed of an analyzer 21, a mapping processor 22, a mapping processor 61, an output unit 23, and a drive 24. In FIG. 6 herein, like numerals are given to portions corresponding to the case in FIG. 1, and description of such portions will be reduced or omitted.

Input signals are supplied to the audio signal processing apparatus 51 as a left-channel audio signal and a right-channel audio signal constituting a movie or other content, for example. In other words, the left-channel input signal is supplied to the analyzer 21 and the mapping processor 22, while the right-channel input signal is supplied to the analyzer 21 and the mapping processor 61.

The analyzer 21 analyzes the respective characteristics of the supplied left- and right-channel input signals, generates mapping control information on the basis of the two sets of analysis results thus obtained, and supplies the mapping control information to the mapping processor 22 and the mapping processor 61.

The mapping processor 61 uses the mapping control information supplied from the analyzer 21 to conduct a mapping process on the supplied right-channel input signal and generates a right-channel output signal. At this point, a process similar to that of the mapping processor 22 is conducted in the mapping processor 61. The mapping processor 61 supplies the right-channel output signal obtained by the mapping process to the output unit 23.

In this way, in the audio signal processing apparatus 51, shared mapping control information is used to conduct mapping processes in the mapping processor 22 and the mapping processor 61.

The output unit 23 may output the left- and right-channel output signals supplied from the mapping processor 22 and the mapping processor 61 to a subsequent unit or to the drive 24 for recording to the removable medium 25.

[Description of Conversion Process]

Figure 7:
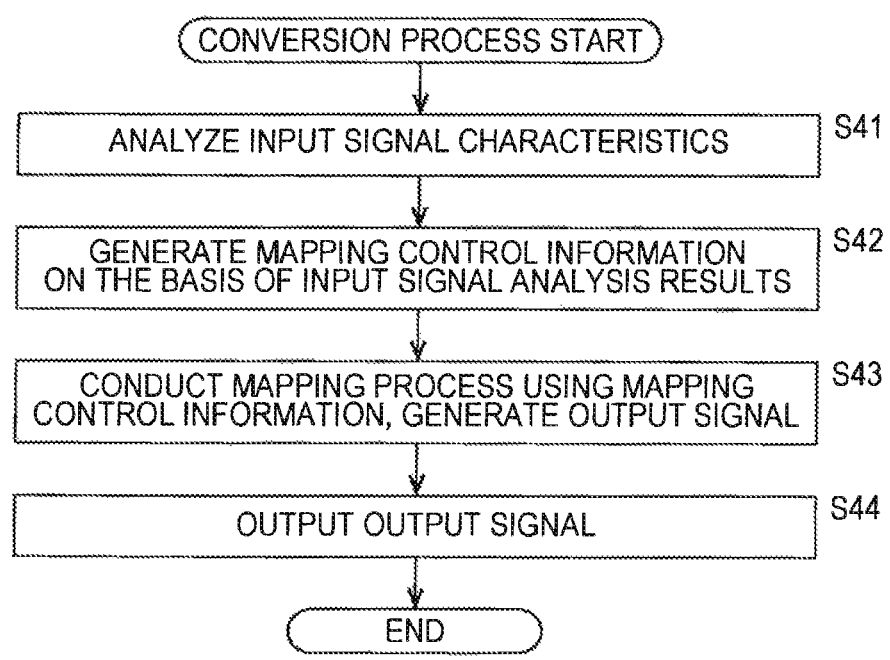
FIG. 7 is a flowchart explaining a conversion process.

Next, a conversion process conducted by the audio signal processing apparatus 51 will be described with reference to the flowchart in FIG. 7.

In step S41, the analyzer 21 analyzes the characteristics of supplied left- and right-channel input signals. For example, the analyzer 21 may perform the computation in Eq. 1 discussed earlier, and compute a left-channel root mean square RMS(n) and a right-channel root mean square RMS(n).

In step S42, the analyzer 21 generates mapping control information on the basis of the input signal characteristics analysis results, and supplies the mapping control information to the mapping processor 22 and the mapping processor 61. For example, the analyzer 21 may compute the average of the left-channel root mean square RMS(n) and the right-channel root mean square RMS(n), and take the obtained average to be the mapping control information.

However, it may also be configured such that the larger value of the left-channel root mean square RMS(n) and the right-channel root mean square RMS(n) may be taken without change as the mapping control information. Also, samples from the left-channel input signal and samples from the right-channel input signal may be used to compute a single root mean square RMS(n), etc. as the mapping control information.

Once the operation in step S42 is conducted and mapping control information is generated, the operations in steps S43 and S44 are subsequently conducted and the conversion process ends. However, since these processing operations are similar to the operations in steps S12 and S13 of FIG. 2, their description will be reduced or omitted.

However, in step S43, the mapping control information is used in the mapping processor 22 and the mapping processor 61, and a left-channel output signal and a right-channel output signal are respectively generated with identical mapping functions and control factors.

In so doing, the audio signal processing apparatus 51 analyzes the characteristics of left- and right-channel input signals, generates common mapping control information for the left and right channels, and uses the obtained mapping control information to conduct an identical mapping process on each channel. By using common mapping control information for the left and right channels to conduct an identical mapping process on per-channel input signals in this way, the playback level of an audio signal can be enhanced without changing the inter-channel volume balance.

Although the foregoing describes a case where two left- and right-channel input signals are input, an input signal may also be composed of three or more channels. Even in such cases, common mapping control information is generated for all channels.

Third Embodiment

Configuration of Audio Signal Processing Apparatus

Also, although the foregoing describes using a single mapping function to generating an output signal, a plurality of linear or nonlinear mapping functions may be prepared, and it may be configured such that an output signal is generated by selectively using those mapping functions according to the mapping control information. In such cases, changes in the output that occur due to switching the mapping function used to generate the output signal can be made smoother by taking the output signal to be a weighted sum of outputs from plural mapping functions depending on the mapping control information.

Figure 8:
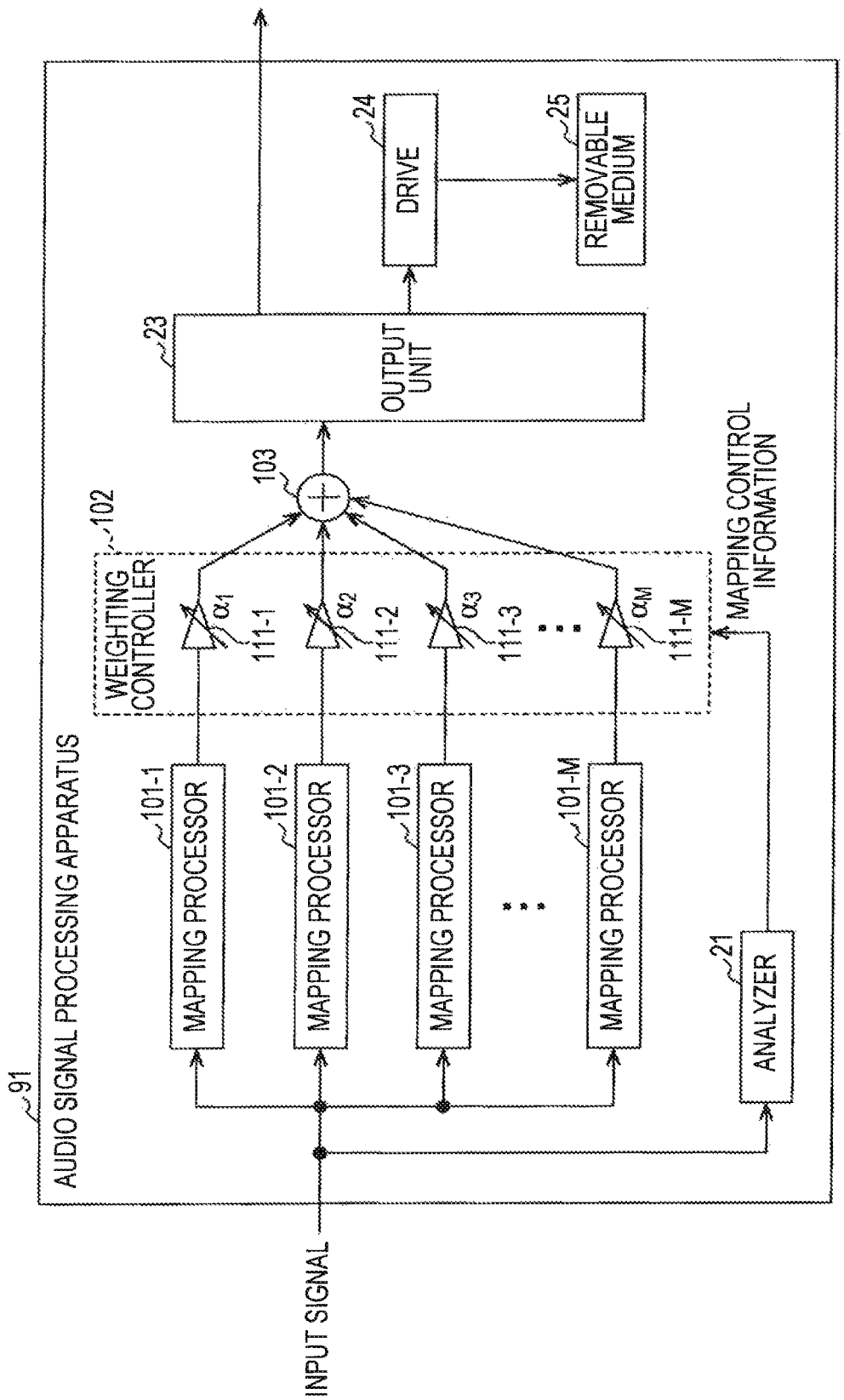
FIG. 8 is a diagram illustrating another exemplary configuration of an audio signal processing apparatus.

In this way, in the case of generating an output signal by using a plurality of mapping functions, an audio signal processing apparatus may take the configuration illustrated in FIG. 8, for example.

Namely, the audio signal processing apparatus 91 is composed of an analyzer 21, mapping processors 101-1 to 101-M, a weighting controller 102, an adder 103, an output unit 23, and a drive 24. In FIG. 8 herein, like numerals are given to portions corresponding to the case in FIG. 1, and description of such portions will be reduced or omitted.

The mapping processors 101-1 to 101-M each conduct a mapping process on a supplied input signal using respectively different mapping functions, and supply the output signals obtained as a result to the weighting controller 102. Note that hereinafter, the mapping processors 101-1 to 101-M will also be simply designated the mapping processors 101 in cases where it is not necessary to individually distinguish them.

The weighting controller 102 multiplies output signals supplied from the mapping processors 101 by distribution ratios, which are weights determined by mapping control information supplied from the analyzer 21, and supplies the result to the adder 103. In other words, the weighting controller 102 is provided with multipliers 111-1 to 111-M. The multipliers 111-1 to 111-M multiply output signals supplied from the mapping processors 101-1 to 101-M by distribution ratios $\alpha_1$ to $\alpha_M$ determined by mapping control information, and supply the results to the adder 103.

Note that hereinafter, the multipliers 111-1 to 111-M will also be simply designated the multipliers 111 in cases where it is not necessary to individually distinguish them.

The adder 103 adds together M output signals supplied from the multipliers 111, and supplies the final output signal obtained as a result to the output unit 23.

[Description of Conversion Process]

Next, a conversion process conducted by the audio signal processing apparatus 91 will be described with reference to the flowchart in FIG. 9.

In step S71, the analyzer 21 analyzes the characteristics of a supplied input signal. For example, the analyzer 21 may perform the computation in Eq. 1 discussed earlier, compute the root mean square RMS(n) for the nth sample of the input signal as mapping control information, and supply the mapping control information to the weighting controller 102.

In step S72, the mapping processors 101 conduct a mapping process on supplied input signals, and supply the obtained output signals to the multipliers 111.

For example, assume that the audio signal processing apparatus 91 is provided with four mapping processors 101-1 to 101-4. In this case, the mapping processors 101-1 to 101-4 conduct a mapping process on supplied input signals by using the mapping functions $f_1(x)$ to $f_4(x)$ expressed in the following Eqs. 8 to 11. In other words, the value obtained by substituting in a mapping function for the sample value x of the nth sample of an input signal is taken to be the sample value of the nth sample of an output signal.

[Expression 8]

$$f_1(x) = x \quad (-1.0 \leq x \leq 1.0) \tag{8}$$

$$f_2(x) = \frac{2}{1+e^{-5x}} - 1 \quad (-1.0 \leq x \leq 1.0) \tag{9}$$

$$f_3(x) = \frac{2}{1+e^{-7x}} - 1 \quad (-1.0 \leq x \leq 1.0) \tag{10}$$

$$f_4(x) = \frac{2}{1+e^{-10x}} - 1 \quad (-1.0 \leq x \leq 1.0) \tag{11}$$

In Eqs. 8 to 11 herein, x represents the sample value of an input signal sample. In Eqs. 8 to 11, the input signal sample value x is taken to be normalized to a value from −1 to 1.

These mapping functions $f_1(x)$ to $f_4(x)$ are functions ordered from the mapping function $f_4(x)$ to the mapping function $f_1(x)$ in order of steepest characteristics.

Figure 10:
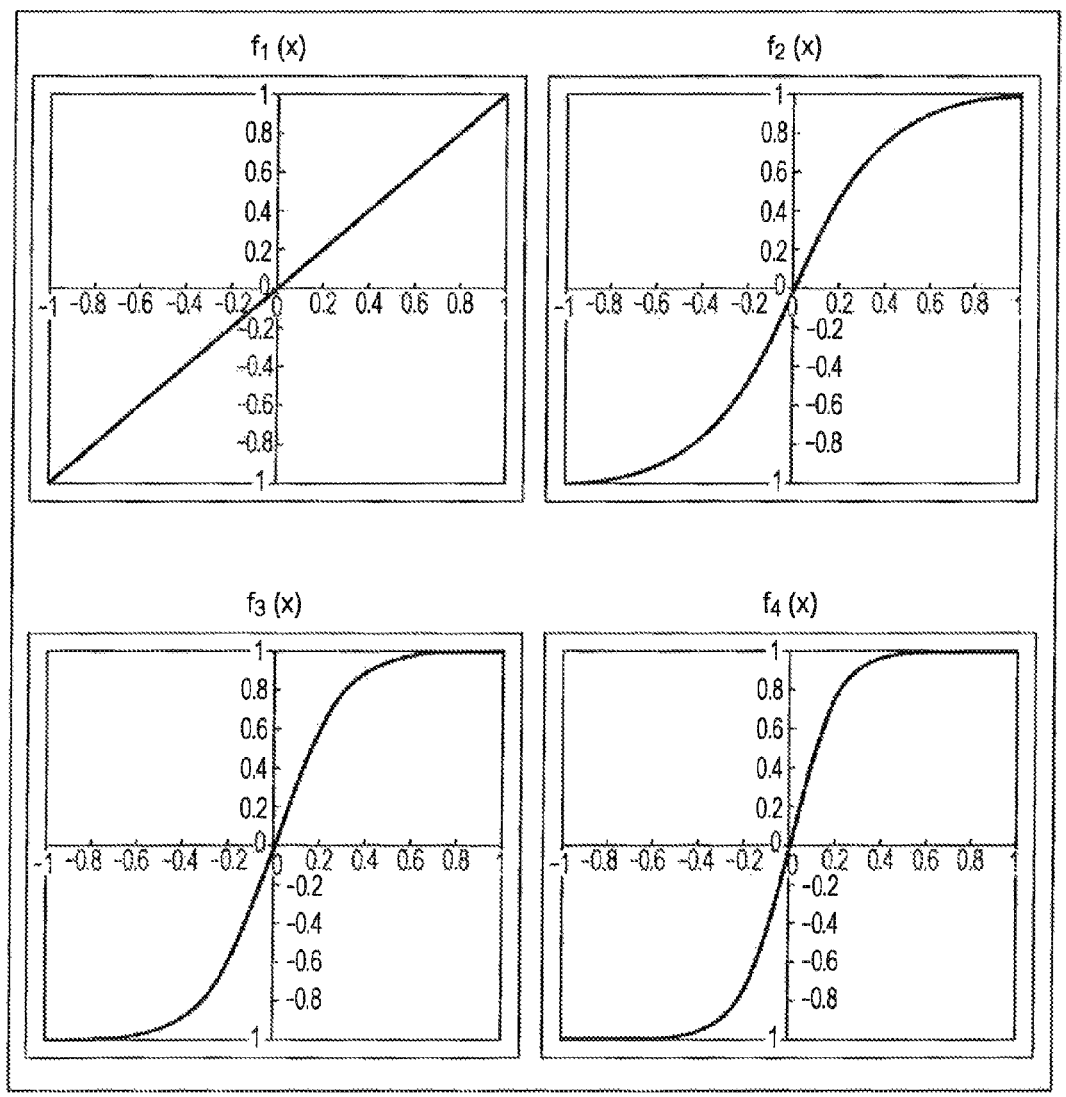
FIG. 10 is a diagram illustrating exemplary mapping functions.

In FIG. 10 herein, the mapping functions $f_1(x)$ to $f_4(x)$ are illustrated in the upper-left, the upper-right, the lower-left, and the lower-right, respectively. Also, in FIG. 10, the horizontal axis represents the sample value x of an input signal, while the vertical axis represents the value of a mapping function.

For example, in the drawing, the mapping function $f_1(x)$ =x illustrated in the upper-left is a linear first-order function, in which a sample value x in an input signal is taken without change as a sample value in an output signal. Also, the mapping functions $f_2(x)$ to $f_4(x)$ are nonlinear exponential functions ordered from the mapping function $f_4(x)$ to the mapping function $f_2(x)$ in order of steepest characteristics in the segment for most sample values x, including sample values x equal to 0. In other words, the mapping functions are ordered from the mapping function $f_4(x)$ to the mapping function $f_2(x)$ in order of the highest rate of change in the mapping function output versus change in the sample value x.

Figure 9:
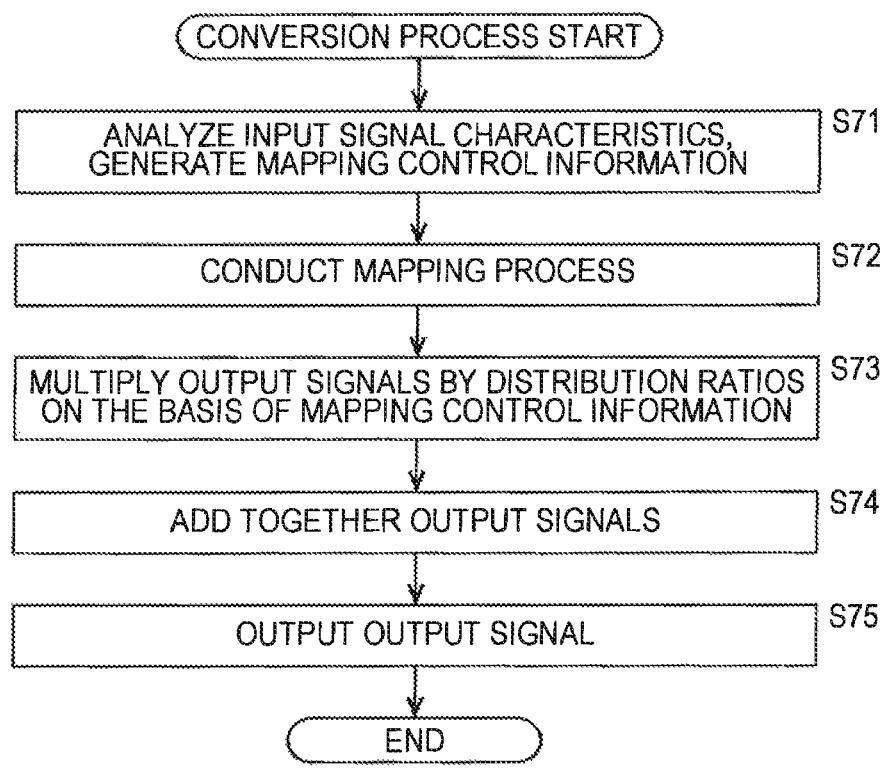
FIG. 9 is a flowchart explaining a conversion process.

Returning to description of the flowchart in FIG. 9, in step S73, the weighting controller 102 multiplies output signals supplied from the mapping processors 101 by distribution ratios acting as weights, on the basis of mapping control information supplied from the analyzer 21.

For example, assume that the audio signal processing apparatus 91 is provided with four mapping processors 101-1 to 101-4. In this case, the weighting controller 102 performs the computation expressed in the following Eq. 12 and computes distribution ratios $\alpha_1$ to $\alpha_4$ for the mapping functions $f_1(x)$ to $f_4(x)$, on the basis of the root mean square RMS(n) given as mapping control information.

[Expression 9]

$$\begin{cases} \alpha_1 = 1.0 - \dfrac{RMS(n)}{-12.0},\ \alpha_2 = 1.0 - \alpha_1, & (-12.0 < RMS(n) \leq 0.0) \\ \alpha_3 = \alpha_4 = 0.0 & \\ \alpha_1 = 0.0,\ \alpha_2 = 1.0 - \dfrac{RMS(n)+12.0}{-12.0}, & (-24.0 < RMS(n) \leq -12.0) \\ \alpha_3 = 1.0 - \alpha_2,\ \alpha_4 = 0.0 & \\ \alpha_1 = \alpha_2 = 0.0, & \\ \alpha_3 = 1.0 - \dfrac{RMS(n)+24.0}{-12.0},\ \alpha_4 = 1.0 - \alpha_3 & (-32.0 < RMS(n) \leq -24.0) \\ \alpha_1 = \alpha_2 = \alpha_3 = 0.0,\ \alpha_4 = 1.0 & (RMS(n) \leq -32.0) \end{cases} \tag{12}$$

In other words, in the case where the root mean square RMS(n) is greater than −12 but 0 or less, the distribution ratios are taken to be $\alpha_1=1-\text{RMS}(n)/-12$, $\alpha_2=1-\alpha_1$, and $\alpha_3=\alpha_4=0$. Herein, $\alpha_2$ in the distribution ratio $\alpha_2$ represents the value of the distribution ratio $\alpha_1$.

Also, in the case where the root mean square RMS(n) is greater than −24 but −12 or less, the distribution ratios are taken to be $\alpha_1=\alpha_4=0$, $\alpha_2=1-(\text{RMS}(n)+12)/-12$, and $\alpha_3=1-\alpha_2$. Herein, $\alpha_3$ in the distribution ratio $\alpha_3$ represents the value of the distribution ratio $\alpha_2$.

Additionally, in the case where the root mean square RMS(n) is greater than −32 but −24 or less, the distribution ratios are taken to be $\alpha_1=\alpha_2=0$, $\alpha_3=1-(\text{RMS}(n)+24)/-12$, and $\alpha_4=1-\alpha_3$. Herein, $\alpha_3$ in the distribution ratio $\alpha_4$ represents the value of the distribution ratio $\alpha_3$. In the case where the root mean square RMS(n) is −32 or less, the distribution ratios are taken to be $\alpha_1=\alpha_2=\alpha_3=0$ and $\alpha_4=1$.

In this way, the weighting controller 102 computes distribution ratios $\alpha_1$ to $\alpha_4$ such that the weights on steeper mapping functions increase as the root mean square RMS(n) decreases, or in other words, as the volume of audio based on an input signal decreases overall. In contrast, distribution ratios are computed such that the weights increase on mapping functions with gentler characteristics in segments with high-volume audio based on an input signal.

Consequently, amplitude conversion of an input signal is conducted such that weights are placed on steeper mapping functions in segments with low-volume audio in an input signal.

In so doing, once distribution ratios are computed for the mapping functions, the multipliers 111-1 to 111-4 multiply output signals supplied from the mapping processors 101-1 to 101-4 by distribution ratios $\alpha_1$ to $\alpha_4$, and supply the results to the adder 103.

In the foregoing, it is described that output signals are first generated in the mapping processors 101, and then distribution ratios by which to multiply those output signals are computed. However, it may also be configured such that mapping processes are conducted after computing distribution ratios.

In such cases, distribution ratios $\alpha_1$ to $\alpha_M$ may be computed on the basis of mapping control information, for example, and only output signals multiplied by non-zero distribution ratios from among these distribution ratios are generated by mapping processes. In other words, mapping processes are not conducted on input signals in mapping processors 101 which use mapping functions corresponding to a distribution ratio whose value is 0. By configuring it such that only output signals multiplied by non-zero distribution ratios are generated, the computation load can be further reduced, and a final output signal can be rapidly obtained.

Also, although distribution ratios are described as being computed by arithmetic computation, it may also be configured such that a table is prepared in which mapping control information values and values of distribution ratios $\alpha_1$ to $\alpha_M$ determined by those values are recorded in association with each other, with distribution ratios being acquired by table lookup.

In step S74, the adder 103 adds together output signals supplied from the multipliers 111-1 to 111-M, and generates a single, final output signal.

In this way, by using distribution ratios to perform weighted addition of output signals obtained using a plurality of mutually different mapping functions, amplitude conversion of an input signal using a single mapping function can be approximately realized. For example, if the distribution ratios $\alpha_1$ and $\alpha_2$ are taken to be 0 while the distribution ratios $\alpha_3$ and $\alpha_4$ are taken to be given non-zero values, amplitude conversion can be realized using a function having characteristics intermediate between the mapping function $f_3(x)$ and the mapping function $f_4(x)$.

By dynamically varying an approximately generated mapping function according to the characteristics in each segment of an input signal, amplitude conversion with a higher degree of freedom can be realized with the audio signal processing apparatus 91. In other words, by approximately generating a mapping function according to per-segment characteristics in each segment of an input signal, amplitude conversion can be conducted while taking into account not only the characteristics of a segment, but also the sample value of the sample being processed, similarly to the case of the audio signal processing apparatus 11.

Also, by suitably selecting a mapping function, the dynamic range in audio volume can be widened, kept the same, or the dynamic range can be narrowed by amplitude conversion.

Once the operation in step S74, the operation in step S75 is subsequently conducted and the conversion process ends. However, since the operation in step S75 is similar to the operation in step S13 of FIG. 2, its description will be omitted.

In so doing, the audio signal processing apparatus 91 conducts mapping processes on an input signal by using a plurality of mutually different mapping functions, performs weighted addition of the obtained plurality of output signals with distribution ratios obtained from the input signal characteristics analysis results, and takes the result as the final output signal.

In this way, by selectively using mapping functions according to input signal characteristics analysis results to conduct mapping processes and generate an output signal, the playback level of an audio signal can be easily and effectively enhanced without requiring prior analysis or reading ahead of the input signal. Also, faint sounds that have been conventionally difficult to hear can be made easier to hear, while in addition, even sounds that have been comparatively loud conventionally become even easier to hear.

Meanwhile, the audio signal processing apparatus 91 may likewise be configured such that the method for computing mapping control information or distribution ratios is varied according to the output device for the output signal, etc., so as to adjust the degree of enhancement to the playback level of an audio signal.

Also, although the foregoing describes generating an output signal by computing mapping control information and distribution ratios for every single sample of an input signal, mapping control information and distribution ratios may also be computed for every two or more consecutive samples.

Fourth Embodiment

Configuration of Audio Signal Processing Apparatus

Also, although the case of a one-channel input signal as the audio signal was described with FIG. 8, an input signal may also be taken to have plural channels. For example, in the case where a two-channel input signal is input, the audio signal processing apparatus may take the configuration illustrated in FIG. 11.

Figure 11:
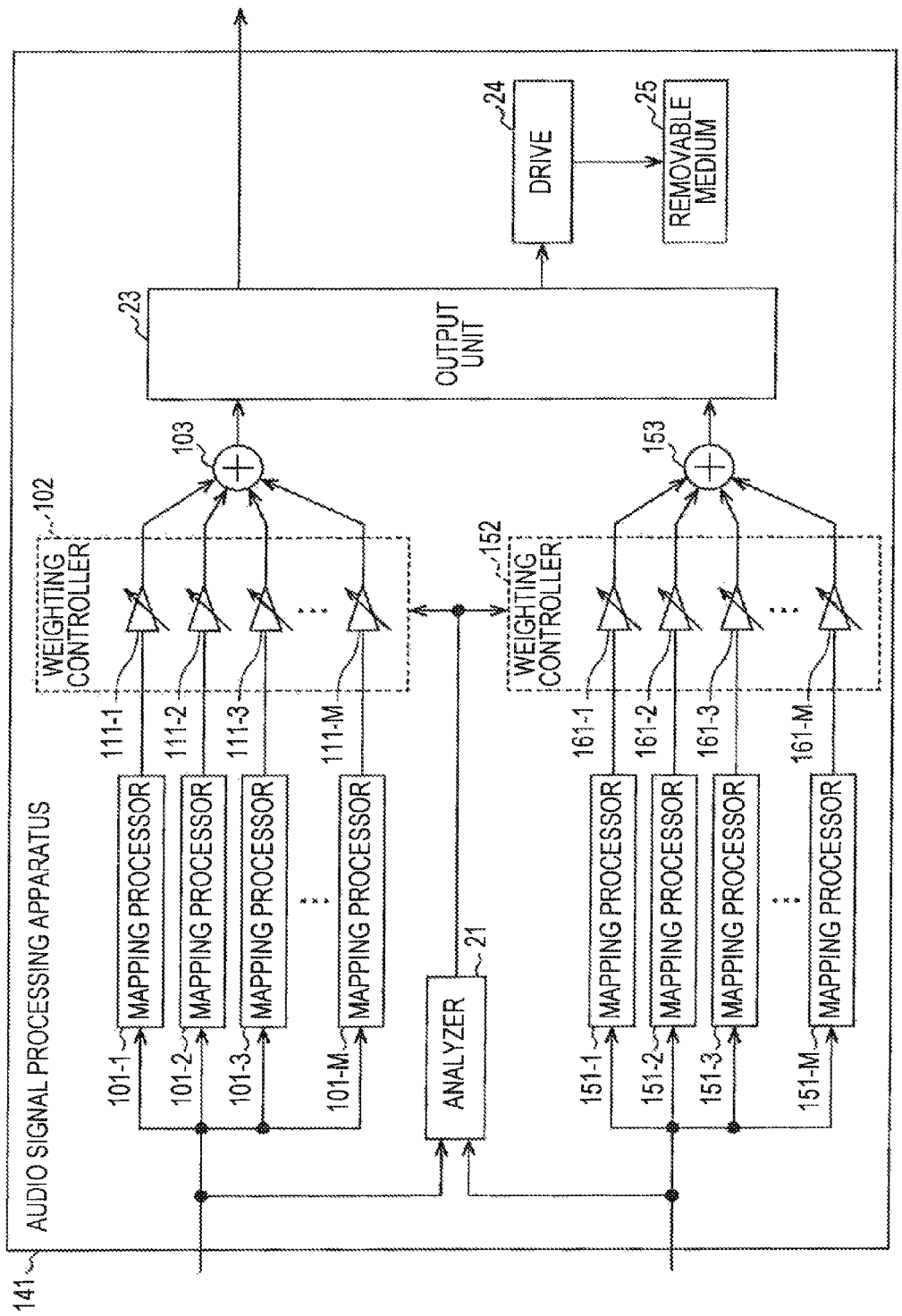
FIG. 11 is a diagram illustrating another exemplary configuration of an audio signal processing apparatus.

The audio signal processing apparatus 141 in FIG. 11 is composed of an analyzer 21, mapping processors 101-1 to 101-M, a weighting controller 102, an adder 103, mapping processors 151-1 to 151-M, a weighting controller 152, and adder 153, an output unit 23, and a drive 24. In FIG. 11 herein, like numerals are given to portions corresponding to the case in FIG. 8, and description of such portions will be reduced or omitted.

Input signals are supplied to the audio signal processing apparatus 141 as a left-channel audio signal and a right-channel audio signal constituting a movie or other content, for example. In other words, the left-channel input signal is supplied to the analyzer 21 and the mapping processors 101-1 to 101-M, while the right-channel input signal is supplied to the analyzer 21 and the mapping processors 151-1 to 151-M.

The analyzer 21 analyzes the respective characteristics of the supplied left- and right-channel input signals, generates mapping control information on the basis of the two sets of analysis results thus obtained, and supplies the mapping control information to the weighting controller 102 and the weighting controller 152.

The mapping processors 151-1 to 151-M conduct mapping processes on a supplied input signal using the same respective mapping functions used by the mapping processors 101-1 to 101-M. Also, the mapping processors 151-1 to 151-M supply output signals obtained by the mapping processes to the weighting controller 152. Note that hereinafter, the mapping processors 151-1 to 151-M will also be simply designated the mapping processors 151 in cases where it is not necessary to individually distinguish them.

The weighting controller 152 conducts the same operation as the weighting controller 102. In other words, multipliers 161-1 to 161-M constituting the weighting controller 152 correspond to the multipliers 111-1 to 111-M, multiplying output signals supplied from the mapping processors 151-1 to 151-M by distribution ratios $\alpha_1$ to $\alpha_M$ and supplying the results to the adder 153. Note that hereinafter, the multipliers 161-1 to 161-M will also be simply designated the multipliers 161 in cases where it is not necessary to individually distinguish them.

The adder 153 adds together M output signals supplied from the multipliers 161, and supplies the final output signal obtained as a result to the output unit 23.

[Description of Conversion Process]

Figure 12:
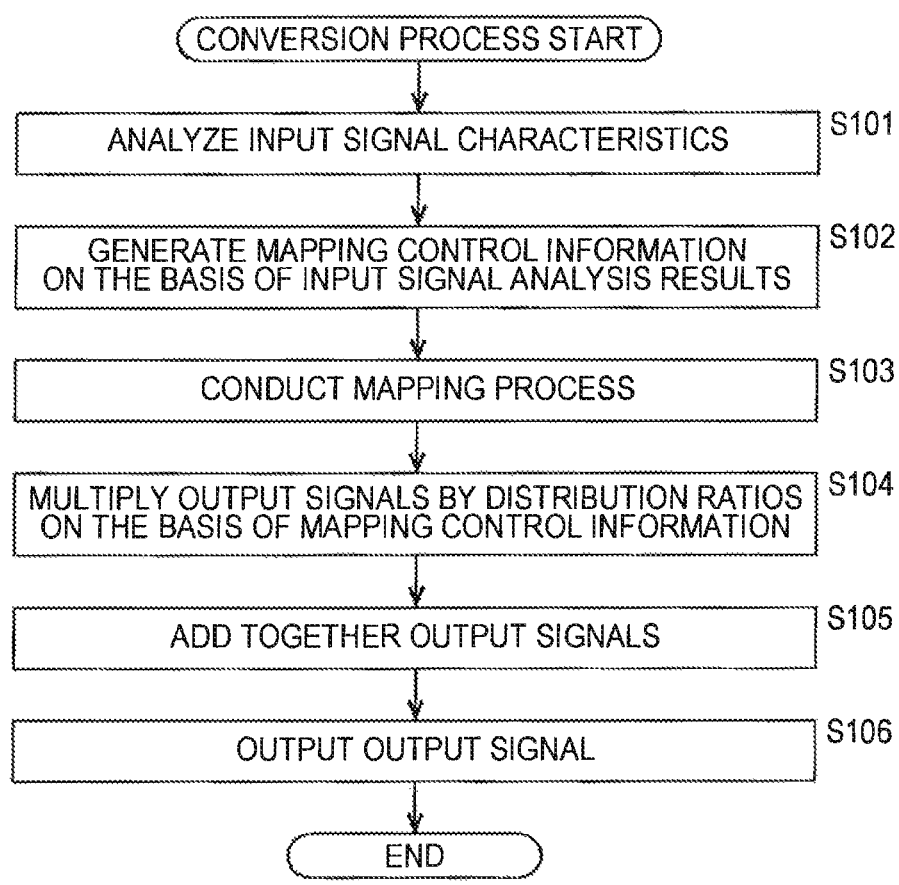
FIG. 12 is a flowchart explaining a conversion process.

Next, a conversion process conducted by the audio signal processing apparatus 141 will be described with reference to the flowchart in FIG. 12.

In step S101, the analyzer 21 analyzes the characteristics of supplied left- and right-channel input signals. For example, the analyzer 21 may perform the computation in Eq. 1 discussed earlier, and compute a left-channel root mean square RMS(n) and a right-channel root mean square RMS(n).

In step S102, the analyzer 21 generates mapping control information on the basis of the input signal characteristics analysis results, and supplies the mapping control information to the weighting controller 102 and the weighting controller 152. For example, the analyzer 21 may compute the average of the left-channel root mean square RMS(n) and the right-channel root mean square RMS(n), and take the obtained average to be the mapping control information.

Once the operation in step S102 is conducted and mapping control information is generated, the operations in steps S103 to S106 are subsequently conducted and the conversion process ends. However, since these processing operations are similar to the operations in steps S72 to S75 of FIG. 9, their description will be reduced or omitted.

However, in steps S103 to S105, mapping processes are conducted in the mapping processors 101, the obtained output signals are multiplied by distribution ratios in the multipliers 111, the output signals which have been multiplied by the distribution ratios are added together in the adder 103, and the result is taken to be the final left-channel output signal. Similarly, mapping processes are conducted in the mapping processors 151, the obtained output signals are multiplied by distribution ratios in the multipliers 161, the output signals which have been multiplied by the distribution ratios are added together in the adder 153, and the result is taken to be the final right-channel output signal.

In so doing, the audio signal processing apparatus 141 analyzes the characteristics of left- and right-channel input signals, generates common mapping control information for the left and right channels, and uses the obtained mapping control information to compute a common distribution ratio for the left and right channels for each mapping function. By using common mapping control information for the left and right channels to compute common distribution ratios for the left and right channels for each mapping function in this way, the playback level of an audio signal can be enhanced without changing the inter-channel volume balance.

The series of processes discussed in the foregoing may be executed in hardware, but may also be executed in software. In the case of executing the series of processes in software, a program constituting such software is installed from a program recording medium to a computer built into special-purpose hardware, or a computer such as a general-purpose personal computer, for example, able to execute various functions by installing various programs thereon.

Figure 13:
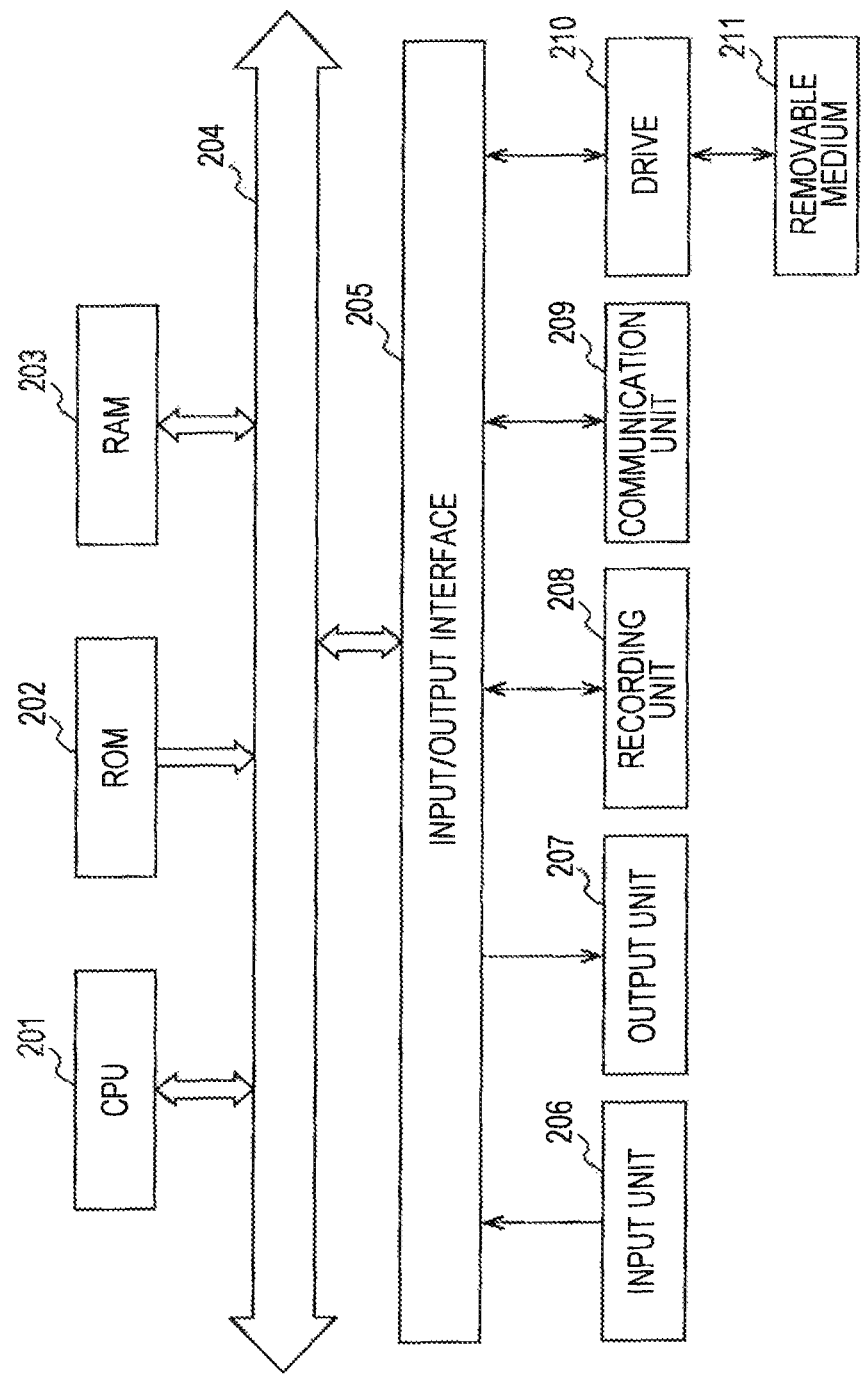
FIG. 13 is a block diagram illustrating an exemplary configuration of a computer.

FIG. 13 is a block diagram illustrating an exemplary hardware configuration of a computer that executes the series of processes discussed in the foregoing with a program.

In a computer, a CPU (Central Processing Unit) 201, ROM (Read-Only Memory) 202, and RAM (Random Access Memory) 203 are connected to each other by a bus 204.

An input/output interface 205 is additionally connected to the bus 204. Connected to the input/output interface 205 are an input unit 206 comprising a keyboard, mouse, microphone, etc., an output unit 207 comprising a display, speakers, etc., a recording unit 208 comprising a hard disk, non-volatile memory, etc., a communication unit 209 comprising a network interface, etc., and a drive 210 that drives a removable medium 211 such as a magnetic disk, an optical disc, a magneto-optical disc, or semiconductor memory.

In a computer configured as above, the series of process discussed in the foregoing is conducted due to the CPU 201 loading a program recorded in the recording unit 208 into the RAM 203 via the input/output interface 205 and the bus 204, and executing the program, for example.

A program executed by the computer (CPU 201) may for example be provided by being recorded onto a removable medium 211 as an instance of packaged media consisting of magnetic disks (including flexible disks), optical discs (including CD-ROMs (Compact Disc-Read-Only Memory), DVDs (Digital Versatile Disc), etc.), magneto-optical discs, or semiconductor memory. Alternatively, a program may be provided via a wired or wireless transmission medium such as a local area network, the Internet, or digital satellite broadcasting.

Additionally, a program may be installed to the recording unit 208 via the input/output interface 205 by loading the removable medium 211 into the drive 210. Also, a program may be received by the communication unit 209 via a wired or wireless transmission medium and installed to the recording unit 208. Otherwise, a program may be installed in advance to the ROM 202 or the recording unit 208.

Herein, a program executed by a computer may be a program in which operations are conducted in a time series following the order described in this specification, but may also be a program in which operations are executed in parallel or at required timings, such as upon being called.

Furthermore, an embodiment of the present invention is not limited to the embodiments discussed in the foregoing, and various modifications are possible within a scope that does not depart from the principal matter of the present invention.

REFERENCE SIGNS LIST

11 audio signal processing apparatus
21 analyzer
22 mapping processor
61 mapping processor
101-1 to 101-M, 101 mapping processors
102 weighting controller
103 adder
151-1 to 151-M, 151 mapping processors
152 weighting controller
153 adder

The invention claimed is:

1. A signal processing apparatus comprising:
a circuitry configured to
  initiate an analysis of input signal characteristics;
  initiate an amplitude conversion of the input signal on the basis of a predetermined linear function or non-linear function;
  initiate a multiplication of a plurality of the input signals, which have been respectively amplitude-converted on the basis of a plurality of mutually different functions, by respective weights determined by a result of the analysis of the input signal characteristics; and
  initiate a generation of an output signal by adding together the plurality of the input signals which have been multiplied by the weights,
wherein as a volume of audio based on the input signal decreases overall, the amplitude conversion of the input signal is conducted using a mapping function having a steeper slope.

2. The signal processing apparatus according to claim 1, wherein the circuitry is further configured to
initiate a computation of a value expressing an average sample value of samples included in a given segment of the input signal as the analysis result.

3. The signal processing apparatus according to claim 2, wherein
the analysis result is a root mean square or a moving average of sample values of samples included in the given segment.

4. The signal processing apparatus according to claim 1, wherein
in a case where amplitude conversion is conducted on the input signal for each of a plurality of channels to generate an output signal for each channel, one analysis result is computed and shared by all channels.

5. The signal processing apparatus according to claim 1, wherein
the weights are determined by the analysis result for every single sample of the input signal.

6. The signal processing apparatus according to claim 1, wherein
the weights are determined by the analysis result for every given number of two or more consecutive samples of the input signal.

7. A signal processing method comprising:
analyzing input signal characteristics,
conducting amplitude conversion of the input signal on the basis of a predetermined linear function or nonlinear function,
respectively multiplying a plurality of the input signals, which have been amplitude-converted on the basis of a plurality of mutually different functions, by weights determined by a result of the analysis of the input signal characteristics, and
generating an output signal by adding together the plurality of input signals which have been multiplied by the weights,
wherein as a volume of audio based on the input signal decreases overall, the amplitude conversion of the input signal is conducted using a mapping function having a steeper slope.

8. A signal processing apparatus comprising:
a circuitry configured to
  initiate an analysis of input signal characteristics; and
  initiate a generation of an output audio signal by conducting amplitude conversion of the input signal on the basis of a nonlinear function determined by a result of the analysis of the input signal characteristics,
wherein as a volume of audio based on the input signal decreases overall, the amplitude conversion of the input signal is conducted using a mapping function having a steeper slope.

9. The signal processing apparatus according to claim 8, wherein the circuitry is further configured to
initiate a computation of a value expressing an average sample value of samples included in a given segment of the input signal as the analysis result.

10. The signal processing apparatus according to claim 9, wherein
the analysis result is a root mean square or a moving average of sample values of samples included in the given segment.

11. The signal processing apparatus according to claim 8, wherein
in a case where amplitude conversion is conducted on the input signal for each of a plurality of channels to generate an output signal for each channel, one analysis result is computed and shared by all channels on the basis of the input signals in the plurality of channels.

12. The signal processing apparatus according to claim 8, wherein
the nonlinear function is determined by the analysis result for every single sample of the input signal.

13. The signal processing apparatus according to claim 8, wherein
the nonlinear function is determined by the analysis result for every given number of two or more consecutive samples of the input signal.

14. A signal processing method comprising:
analyzing input signal characteristics, and
generating an output audio signal by conducting amplitude conversion of the input signal on the basis of a nonlinear function determined by a result of the analysis of the input signal characteristics, wherein as a volume of audio based on the input signal decreases overall, the amplitude conversion of the input signal is conducted using a mapping function having a steeper slope.

* * * * *